United States Patent
Ng et al.

(10) Patent No.: US 9,357,654 B2
(45) Date of Patent: May 31, 2016

(54) LOW-PROFILE PLUG WITH CAM AND FLEXIBLE CIRCUIT BOARD

(71) Applicant: Apple Inc., Cupertino, CA (US)

(72) Inventors: Nathan Ng, Fremont, CA (US); Paul Yuan, San Jose, CA (US); Min Chul Kim, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 66 days.

(21) Appl. No.: 14/195,823

(22) Filed: Mar. 3, 2014

(65) Prior Publication Data

US 2015/0249297 A1    Sep. 3, 2015

(51) Int. Cl.
| | |
|---|---|
| H01R 3/00 | (2006.01) |
| H05K 3/30 | (2006.01) |
| H01R 31/06 | (2006.01) |
| H05K 1/18 | (2006.01) |
| H01R 24/62 | (2011.01) |

(52) U.S. Cl.
CPC .............. *H05K 3/303* (2013.01); *H01R 31/06* (2013.01); *H05K 1/189* (2013.01); *H01R 24/62* (2013.01); *H05K 2201/056* (2013.01); *H05K 2201/10189* (2013.01); *Y10T 29/4913* (2015.01)

(58) Field of Classification Search
CPC ....... H01R 12/78; H01R 12/79; H01R 12/592
USPC .............. 439/492, 496, 483, 484, 67
See application file for complete search history.

(56) References Cited

U.S. PATENT DOCUMENTS

| | | | |
|---|---|---|---|
| 6,514,089 B2 * | 2/2003 | Satou ..................... | H05K 3/365 439/493 |
| 6,540,559 B1 | 4/2003 | Kemmick et al. | |
| 6,584,336 B1 | 6/2003 | Ali et al. | |
| 6,685,499 B2 * | 2/2004 | Takahashi ............ | H01R 23/661 439/483 |
| 7,125,287 B1 | 10/2006 | Chou et al. | |
| 7,293,122 B1 | 11/2007 | Schubert et al. | |
| 7,442,057 B2 | 10/2008 | Ko | |
| 7,540,788 B2 | 6/2009 | Murphy et al. | |
| 7,544,066 B1 | 6/2009 | Lynch et al. | |
| 7,594,817 B2 * | 9/2009 | Wahlberg ............... | H01R 12/62 439/492 |
| 7,627,343 B2 | 12/2009 | Fadell et al. | |
| 7,684,186 B2 | 3/2010 | Chang | |
| RE41,224 E | 4/2010 | Kubota et al. | |
| 7,709,946 B2 | 5/2010 | Ryu et al. | |
| 7,832,645 B2 | 11/2010 | Chen et al. | |
| 7,909,652 B2 | 3/2011 | Yang et al. | |

(Continued)

FOREIGN PATENT DOCUMENTS

| | | |
|---|---|---|
| CN | 201430312 | 3/2010 |
| CN | 101740961 A | 6/2010 |

(Continued)

*Primary Examiner* — Abdullah Riyami
*Assistant Examiner* — Thang Nguyen
(74) *Attorney, Agent, or Firm* — Kilpatrick Townsend & Stockton LLP (57) ABSTRACT

A cable assembly including a connector insert to fit in a connector receptacle in an electronic device, where a back surface of the connector insert is substantially flush with an outside of an enclosure for the electronic device. One example may provide a cable assembly that includes a connector insert formed by wrapping a flexible circuit board at least partially around a housing. The flexible circuit board may be routed against an underside of the electronic device such that it does not obstruct a user, consume space in a display area, or have an undesirable appearance.

21 Claims, 9 Drawing Sheets

(56) References Cited

U.S. PATENT DOCUMENTS

| | | |
|---|---|---|
| 7,918,689 B2 | 4/2011 | Sloey et al. |
| 7,963,809 B2 | 6/2011 | Hardell et al. |
| 7,988,496 B2 | 8/2011 | Zhu |
| 8,096,815 B2 | 1/2012 | Zhu |
| 8,102,657 B2 | 1/2012 | Hiew et al. |
| 8,113,865 B1 | 2/2012 | Yang et al. |
| 8,118,497 B2 | 2/2012 | Yi |
| 8,342,890 B2 | 1/2013 | Zhu |
| 8,414,337 B2 | 4/2013 | Villarreal et al. |
| 8,485,851 B2 | 7/2013 | kondo et al. |
| 8,532,727 B2 | 9/2013 | Ali et al. |
| 8,727,812 B2 | 5/2014 | Villareal et al. |
| 2002/0024794 A1 | 2/2002 | Lin et al. |
| 2002/0142647 A1* | 10/2002 | Aoki ............ H01R 12/85 439/496 |
| 2007/0295982 A1 | 12/2007 | Ryu et al. |
| 2008/0268711 A1 | 10/2008 | Miyazaki et al. |
| 2009/0061678 A1 | 3/2009 | Minoo et al. |
| 2009/0093136 A1 | 4/2009 | Hiew et al. |
| 2009/0179501 A1 | 7/2009 | Randall |
| 2009/0236140 A1 | 9/2009 | Randall |
| 2009/0247017 A1 | 10/2009 | Wu |
| 2010/0081337 A1 | 4/2010 | Dorogusker et al. |
| 2010/0255712 A1 | 10/2010 | Huang et al. |
| 2011/0218414 A1 | 9/2011 | Kamath et al. |
| 2011/0230076 A1* | 9/2011 | Lim ............ H01R 9/032 439/345 |
| 2012/0015544 A1 | 1/2012 | Wu |
| 2012/0295487 A1 | 11/2012 | Villarreal et al. |
| 2013/0217269 A1 | 8/2013 | Villarreal et al. |
| 2014/0256186 A1 | 9/2014 | Villarreal et al. |

FOREIGN PATENT DOCUMENTS

| | | |
|---|---|---|
| CN | 102856749 | 1/2013 |
| DE | 102012208328 | 11/2012 |
| FR | 2975539 | 11/2012 |
| GB | 2491243 | 4/2014 |
| JP | 63056563 | 4/1988 |
| JP | 03095584 | 9/1991 |
| JP | 2009048978 | 3/2009 |
| JP | 2012243774 | 12/2012 |
| WO | 2012162255 | 11/2012 |

* cited by examiner

LOW-PROFILE PLUG WITH CAM AND FLEXIBLE CIRCUIT BOARD

BACKGROUND

The amount of data transferred between electronic devices has grown tremendously the last several years. Large amounts of audio, streaming video, text, and other types of data content are now regularly transferred among desktop and portable computers, media devices, handheld media devices, displays, storage devices, and other types of electronic devices. Power supply voltages and ground may be transferred with this data.

Power and data may be conveyed over cables that may include wire conductors, fiber optic cables, or some combination of these or other conductors. Cable assemblies may include a connector insert at one or both ends of a cable, though cable assemblies may be connected or tethered to an electronic device in a dedicated manner. The connector inserts may be inserted into receptacles in the communicating electronic devices.

Many of these electronic devices are now being used in retail or other environments where customers and others interact directly with them. These devices may include touch or other types of screens that provide information about various items, products, or services. These screens may also allow users to explore databases to find further information, to request help, to place orders, or to interact in other ways.

Again, conventional cable assemblies include a connector insert at an end of a cable. The connector insert includes an insert portion to fit in a connector receptacle in an electronic device. A housing of the connector insert attaches to the insert portion and does not fit into the connector receptacle, but rather extends orthogonally to an exterior surface of the electronic device. The cable may extend from the housing, also in a direction orthogonal to the exterior surface of the electronic device.

While this housing may be very convenient in that is allows a user to easily insert and remove the connector insert, it may obstruct a user interacting with the electronic device. It may also consume space in a display area and have an undesirable appearance.

Thus, what is needed are cable assemblies including connector inserts that do not obstruct a user, do not consume space in a display area, and do not have an undesirable appearance.

SUMMARY

Accordingly, embodiments of the present invention may provide cable assemblies that do not obstruct a user, do not consume space in a display area, and do not have an undesirable appearance. An illustrative embodiment of the present invention may provide a cable assembly including a connector insert to fit in a connector receptacle in an electronic device, where a back surface of the connector insert is substantially flush with an outside of an enclosure for the electronic device. One such illustrative embodiment of the present invention may provide a cable assembly that includes a flexible circuit board at least partially wrapped around a cam or housing. The flexible circuit board may be routed against an underside of the electronic device such that it does not obstruct a user, does not consume space in a display area, and does not have an undesirable appearance.

An illustrative embodiment of the present invention may include flexible cable at least partially wrapped around a cam or other housing. The flexible cable may be a flexible circuit board, ribbon connector, or other flexible cable. The flexible cable may be substantially flat to aid in keeping the cable out of sight of a user. The flexible cable may have an end portion, with a number of contacts printed or otherwise formed on a first side of the end portion of the flexible cable. The contacts may be electrically connected to conductors in the flexible cable.

One or more circuits or components may be attached to a second side of the flexible cable. In this way, the flexible cable may provide part of an enclosure for the circuits or components. These circuits may include active devices, passive components, integrated circuits, relays, switches, microelectromechanical devices (MEMs), or other electronic or mechanical components. These components may include circuits for power, identification, authorization, theft-prevention, and other functions. The components may be electrically connected to one or more conductors in the flexible cable and the contacts.

These components may be enclosed between the flexible cable and a housing, such as a cam or other type of housing. The housing may be metallic, though in various embodiments of the present invention it may be plastic, resin, ceramic, or other material or combination of these and other materials. The housing may have a first recess and the components may be located in the first recess. The housing may have a second recess and the end portion of the flexible cable may be located in the second recess. The housing or cam may help to enclose and protect the components, act as a plug head, and have a rear portion that conforms to an outside of a device enclosure.

The end portion of the flexible cable may be secured to the housing in the second recess. The end portion may be glued, taped, fixed with adhesive, or otherwise secured in place. The flexible cable may be wrapped at least partially around the housing or cam. This may allow contacts to be on a first side of the flexible cable and may allow the flexible cable to contact and enclose the components and exit the electronic device along its underside.

Again, the housing may have a back end arranged to be substantially flush with an outside of an enclosure for the electronic device. This, combined with the use of a flexible cable that may be discreetly routed, may provide a cable assembly that is unobtrusive, does not consume display area, and does not have an undesirable appearance. When a cable insert according to an embodiment of the present invention is inserted in an electronic device, the cable assembly may provide a connector insert and flexible cable that are not readily viewable by a user while that user is looking at a screen of the electronic device.

Contacts on the end portion of the flexible cable may engage or mate with connectors in the receptacle of the electronic device. Specifically, the housing may be arranged such that the contacts on the first side of the end portion of the flexible cable mate with contacts in the connector receptacle on the electronic device. These connections may be used to convey data, power, startup or configuration information, or other types of signals between the electronic device and one or more other electronic devices or networks.

While these cables may be useful in retail environments where they may rarely be disconnected, it may be desirable to disconnect them on occasion. It may be desirable that these cables not be removed by someone simply grabbing the flexible cable, as this may damage the cable assembly. Accordingly, embodiments of the present invention may include a pull tab for use in disconnecting and removing the cable assembly. This pull tab may be fixed using glue, tape, or adhesive, or otherwise attached to the first side of the flexible cable.

An illustrative embodiment of the present invention may provide a method of forming a cable assembly. This method may include forming a plurality of contacts on a first side at a first end portion of a flexible circuit board. A first component may be attached to a second side of a flexible circuit board. A housing may be aligned over the first component such that the first component fits in a first recess of the housing. A flexible circuit board may be at least partially wrapped around the housing. A pull tab may be attached to the first side of the flexible circuit board to enable the removal of the housing when it is inserted in a receptacle of an electronic device.

Embodiments of the present invention may be used in connector inserts and receptacles for cables that may connect to various types of devices, such as portable computing devices, tablets, desktop computers, laptops, all-in-one computers, cell phones, smart phones, media phones, storage devices, portable media players, navigation systems, monitors, power supplies, adapters, and chargers, and other devices. These connector inserts may provide pathways for signals and power compliant with various standards such as Universal Serial Bus (USB), a High-Definition Multimedia Interface (HDMI), Digital Visual Interface (DVI), power, Ethernet, DisplayPort, Thunderbolt, Lightning and other types of standard and non-standard interfaces.

Various embodiments of the present invention may incorporate one or more of these and the other features described herein. A better understanding of the nature and advantages of the present invention may be gained by reference to the following detailed description and the accompanying drawings.

DESCRIPTION OF ILLUSTRATIVE EMBODIMENTS

Figure 1:
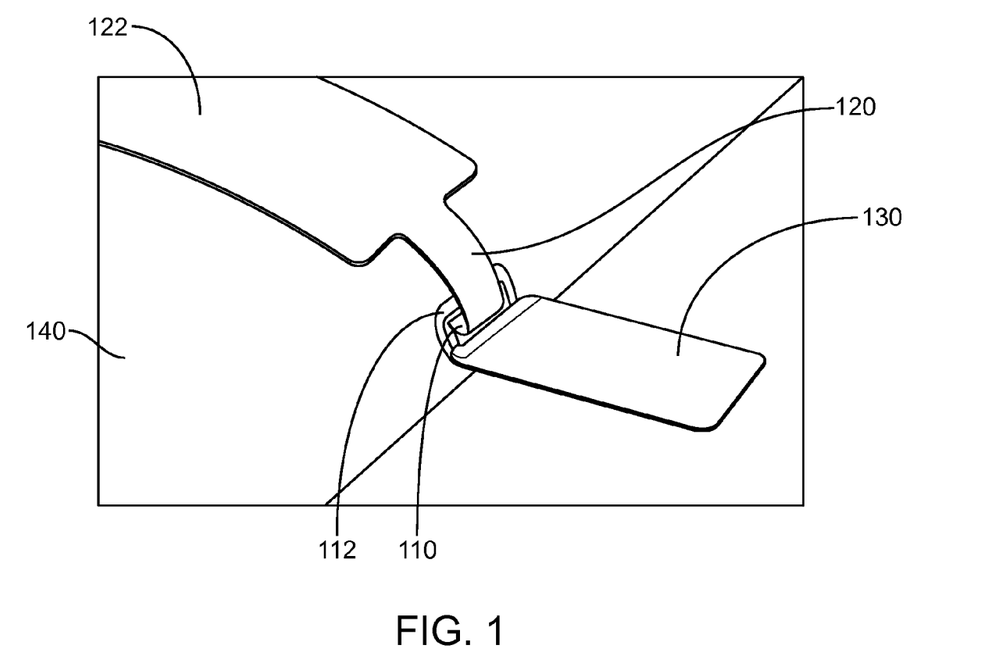
FIG. 1 illustrates a cable assembly according to an embodiment of the present invention.

FIG. 1 illustrates a cable assembly according to an embodiment of the present invention. This figure, as with the other included figures, is shown for illustrative purposes and does not limit either the possible embodiments of the present invention or the claims.

This figure includes a cable assembly including connector insert portion 110 and flexible cable 120. Connector insert portion 110 may be configured to be inserted in receptacle 112 and may have a back that is arranged to fit approximately flush with an outside of an enclosure of electronic device 140. Flexible cable 120 may include a wider portion 122. To assist in removal of connector insert portion 110, a pull tab 130 may be included. Connector insert portion 110 may be removed by pulling on pull tab 130 in a direction approximately orthogonal to a surface of the device enclosure for the electronic device 140.

Again, connector insert portion 110 may be arranged to be substantially flush with a surface of device enclosure 140. Flexible cable 120 may be routed underneath the electronic device and away from connector insert portion 110. Pull tab 130 may similarly be folded underneath the electronic device. This may provide a cable assembly that is not visible to a user who is viewing a screen on the electronic device. (In this figure, the screen may be facing downward towards a surface on which the electronic device is resting.)

Traces or conductors in flexible cable 120 may attach to contacts on connector insert portion 110. These contacts may mate or form electrical connections with contacts in the connector receptacle 112. In this way, power, data, and other signals may be transferred between the electronic device and one or more other electronic devices.

In this specific example, flexible cable 120 may be a flexible circuit board, though in other embodiments of the present invention it may be a ribbon cable or other type of flexible cable.

Figure 2:
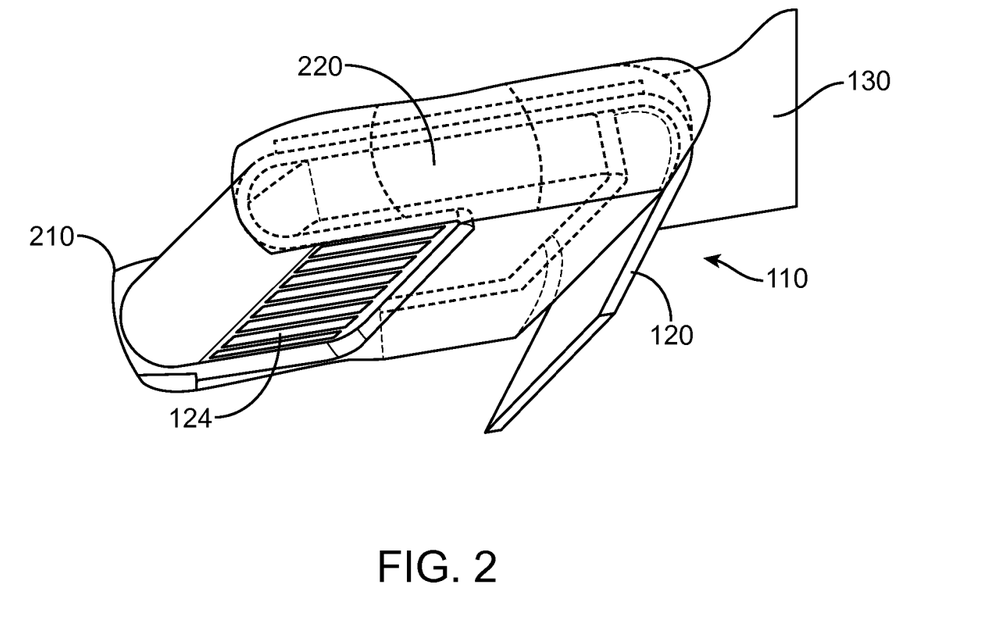
FIG. 2 illustrates a cable assembly according to an embodiment of the present invention.

FIG. 2 illustrates a cable assembly according to an embodiment of the present invention. In this example, flexible cable 120 may be wrapped at least partially around a cam or housing 210. Cam or housing 210 may include a first recess. One or more electronic components 220 may be located in this recess. These components may include active devices, passive components, integrated circuits, relays, switches, microelectromechanical devices (MEMs), or other electronic or mechanical components. These components may include circuits for power, identification, authorization, theft-prevention, and other functions.

One or more contacts 124 may be printed or otherwise formed on flexible cable 120. These contacts may be printed on a first side of a first end portion of flexible cable 120. The end portion of flexible cable 120 may fit in a second recess in housing 210. The first end portion of flexible cable 120 may be glued, attached with adhesive or tape, or otherwise fixed to cam or housing 210. Pull tab 130 may be attached to insert portion 110. For example, pull tab 130 may be glued, fixed with adhesive or tape, or otherwise attached to a first surface of flexible cable 120.

Again, when connector insert portion 110 is inserted into a receptacle, contacts 124 may mate with corresponding contacts in a connector receptacle. Also, flexible cable 120 may be routed away and underneath the electronic device 140 such that the cable assembly is not visible to a user viewing a screen on the electronic device. An example is shown in the following figure.

Figure 3:
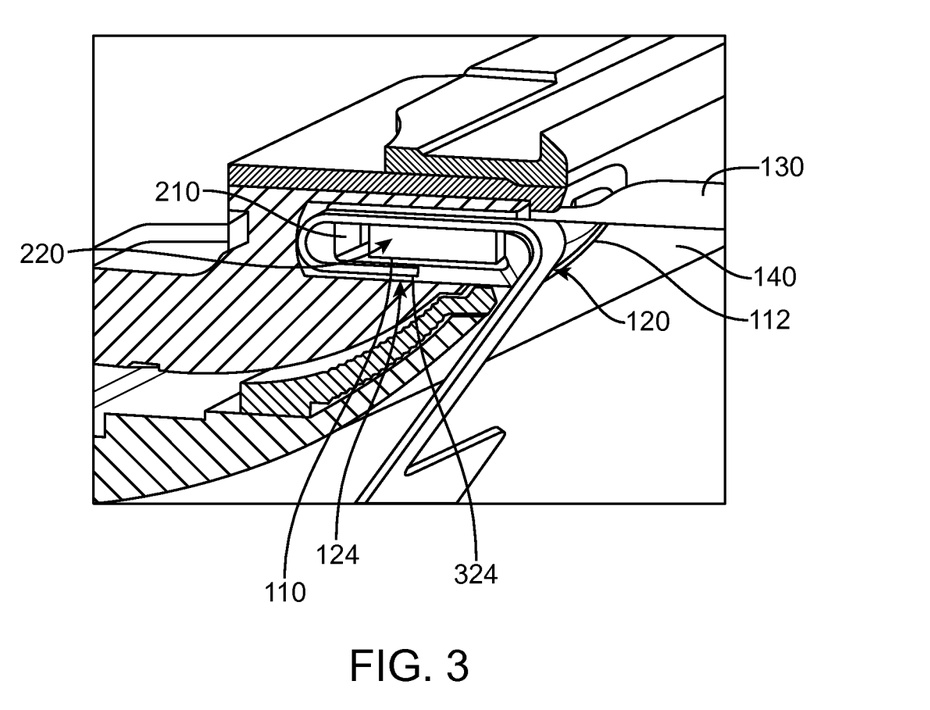
FIG. 3 illustrates a cable assembly inserted into an electronic device in accordance with an embodiment of the present invention.

FIG. 3 illustrates a cable assembly inserted into an electronic device in accordance with an embodiment of the present invention. Again, connector insert portion 110 may include one or more electrical components 220. These electrical components 220 may be housed in a recess in housing or cam 210. Flexible cable 120 may be at least partially wrapped around cam or housing 210. Pull tab 130 may be included to assist in the removal of connector insert portion 110 from electronic device 140. Again, a rear of housing 210 may be arranged to fit substantially flush with an outside surface of an enclosure for electronic device 140.

One or more contacts 124 formed on flexible cable 120 may mate with corresponding contacts 324 in the connector receptacle 112. These connections may convey power, data, startup or configuration information, or other signals between this electronic device 140 and one or more other electronic devices. More specifically, contacts 124 may electrically connect to contacts at a distant end of flexible cable 120. Contacts 124 and distant contacts (not shown) may electrically connect to each other or to components 220. An example of one flexible cable 120 is shown in the following figure.

Figure 4:
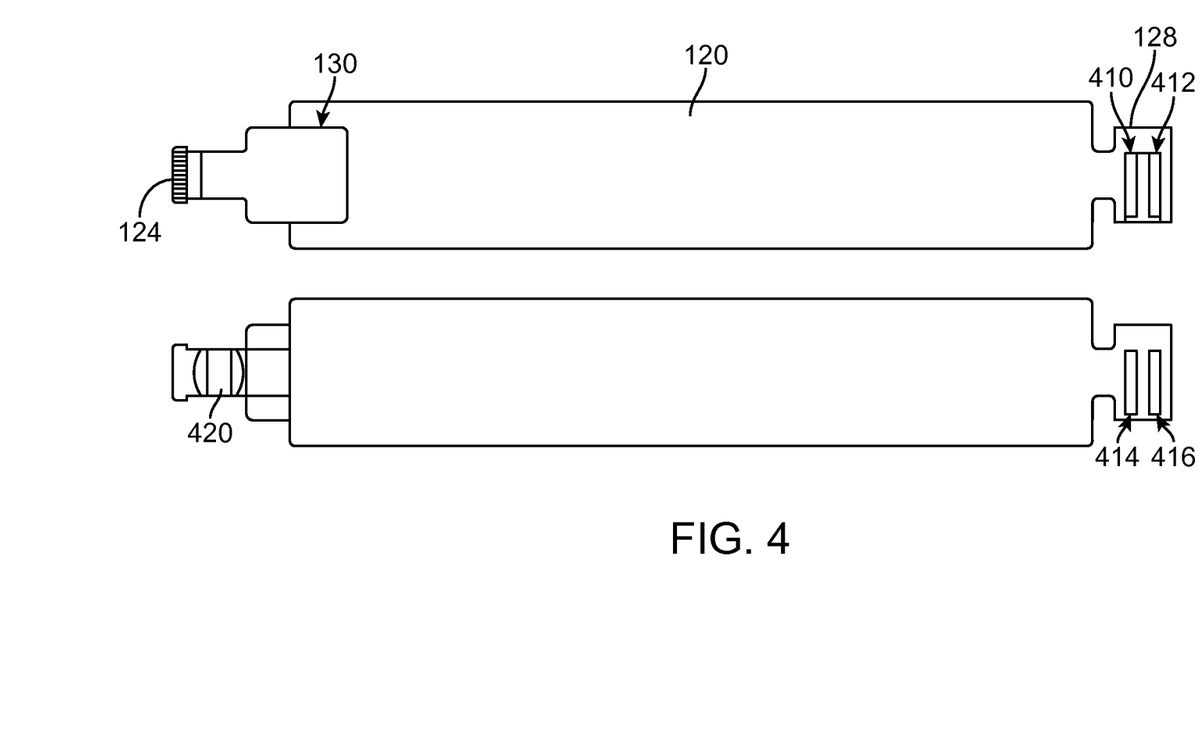
FIG. 4 illustrates a flexible cable according to an embodiment of the present invention.

FIG. 4 illustrates a flexible cable according to an embodiment of the present invention. This flexible cable 120 may include a number of contacts 124 on an end portion of flexible cable 120. Pull tab 130 may also be attached to flexible cable 120. Distant end portion 128 may include a number of contacts 410, 412, 414, and 416. These contacts may convey data and power between electronic device 140 and one or other electronic devices. In a specific embodiment of the present invention, contacts 410 may be a D− contact and contact 412 may be a D+ contact. These contacts may convey a Universal Serial Bus or other differential signal. Contact 414 may be a VBUS contact, while contact 416 may be a ground contact. This second set of contacts may supply power to electronic device 140. A second side of flexible cable 120 may include a contact area 420, where one or more components may be attached. Traces may connect these components to one or more contacts 124, as well as one or more contacts on distant end portion 128.

Connector assemblies consistent with embodiments of the present invention may be manufactured in various ways. An example is shown in the following figure.

Figure 5:
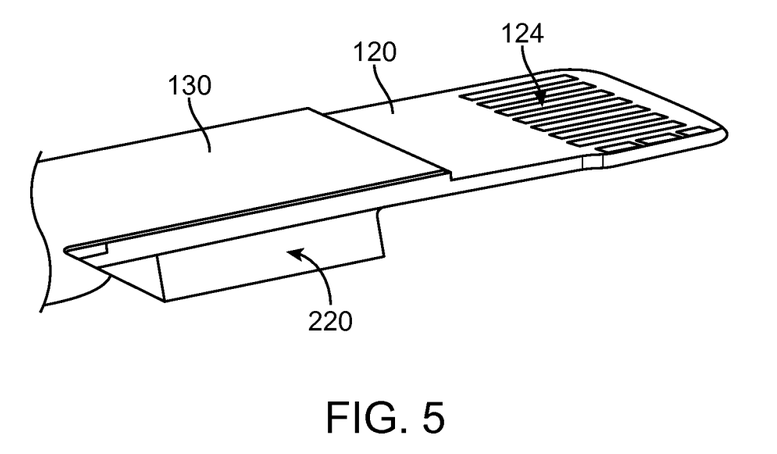
FIG. 5 illustrates an intermediate step in the manufacturing of a cable assembly according to an embodiment of the present invention.

FIG. 5 illustrates an intermediate step in the manufacturing of a cable assembly according to an embodiment of the present invention. One or more contacts 124 may be formed on an end portion of flexible cable 120. Pull tab 130 may be attached to the top surface of flexible cable 120. One or more electrical components 220 may be attached to a second side of flexible cable 120. A cam or housing may be placed over electrical components 220. Flexible cable 120 may be at least partially wrapped around this cam or housing. An example of such a cam or housing is shown in the following figure.

Figure 6:
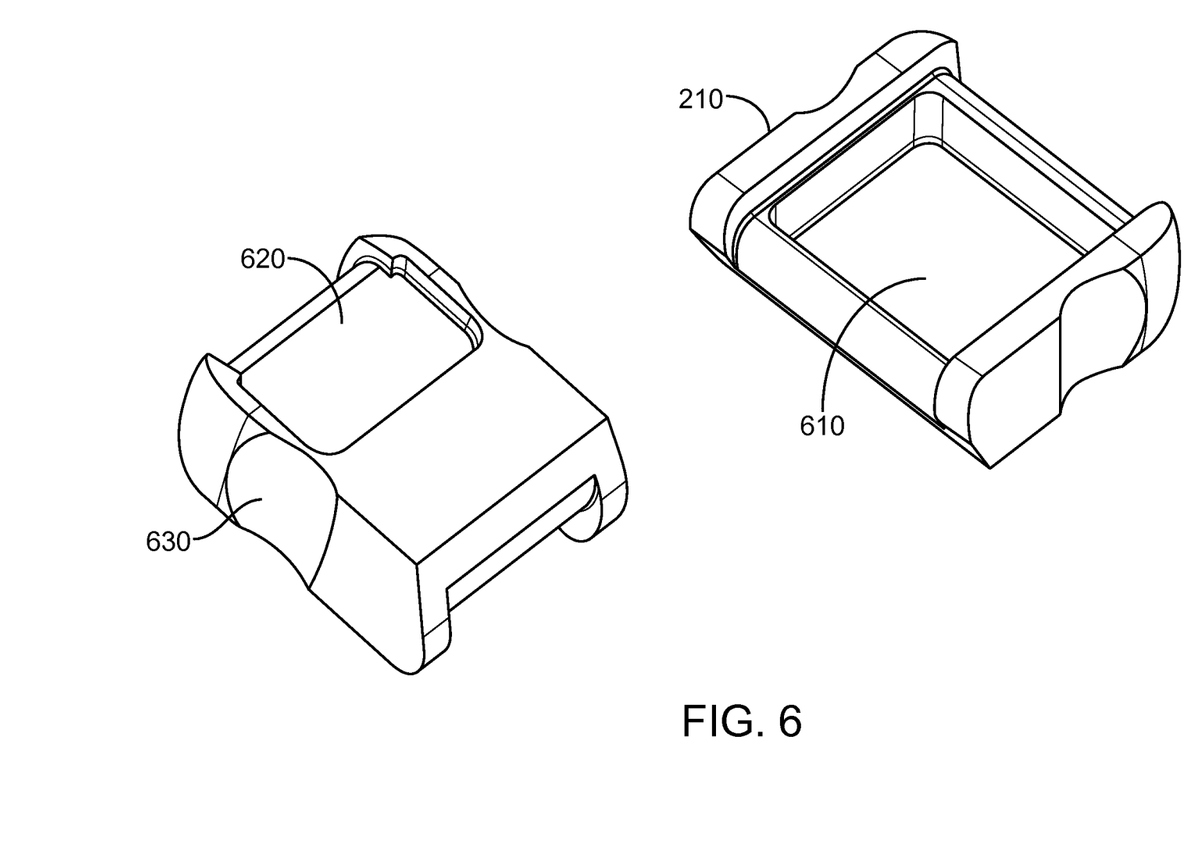
FIG. 6 illustrates a cam or housing 210 according to an embodiment of the present invention.

FIG. 6 illustrates a cam or housing 210 according to an embodiment of the present invention. Cam or housing 210 may include a first recess 610. One or more electrical components 220 may be located in first recess 610. In one example, components 220 may be sealed in a structure that is arranged to fit in first recess 610. This may provide improved heat dissipation for components 220. Cam or housing 210 may protect electrical components 220 and provide a mechanical support for flexible cable 120. Cam or housing 210 may include a second recess 620. An end portion of flexible cable 120 supporting contacts 124 may be located in second recess 620. This end portion may be glued, fixed with adhesive or tape, or otherwise secured to second recess 620. In other embodiments of the present invention, a lip or edge around the recess 620 may be used to secure the flexible cable 120 in place. Cam or housing 210 may further include side indentations 630, which may be grasped by a user during insertion into electronic device.

Figure 7:
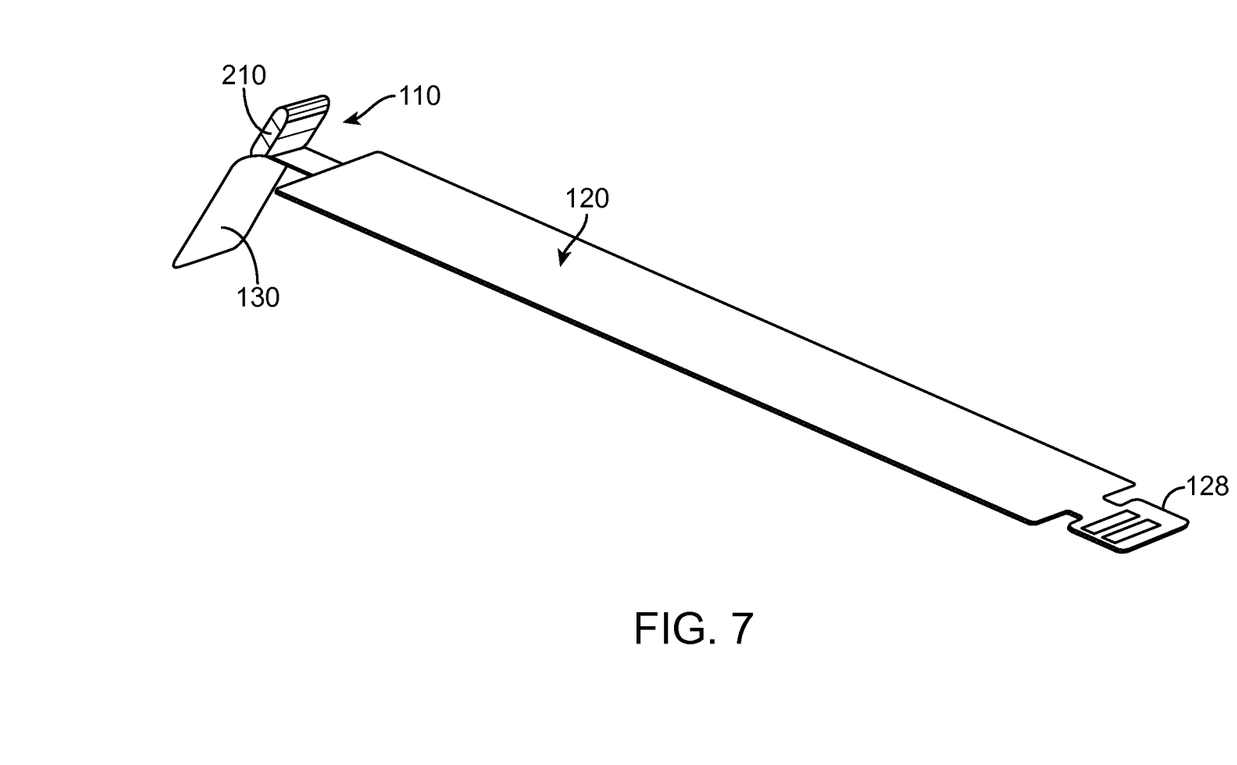
FIG. 7 illustrates a completed cable assembly according to an embodiment of the present invention.

FIG. 7 illustrates a completed cable assembly according to an embodiment of the present invention. Again, flexible cable 120 may be at least partially wrapped around housing 210 to form connector insert portion 110. Pull tab 130 may be attached to connector insert portion 110 to assist in the removal of connector insert portion 110 from an electronic device. An end portion of flexible cable 120 may support a number of contacts that may be electrically connected to contacts 124 on connector insert portion 110 and to one or more electrical components 220 inside housing 210.

Figure 8:
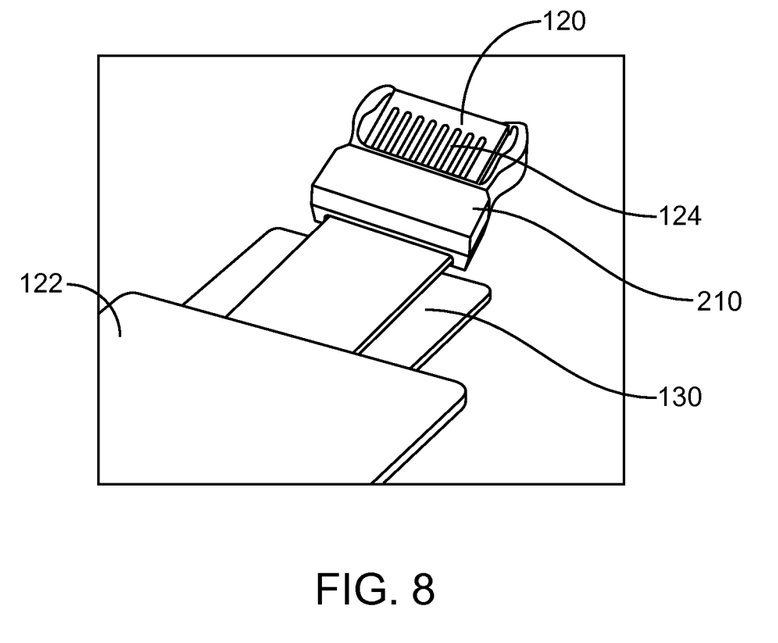
FIG. 8 illustrates a close-up view of a connector insert portion according to an embodiment of the present invention.

FIG. 8 illustrates a close-up view of a connector insert portion according to an embodiment of the present invention. Again, a number of contacts 124 may be located on an end portion of flexible cable 120. Flexible cable 120 may include a wider portion 122. Flexible cable 120 may be at least partially wrapped around housing 210. A pull tab 130 may be included.

Figure 9:
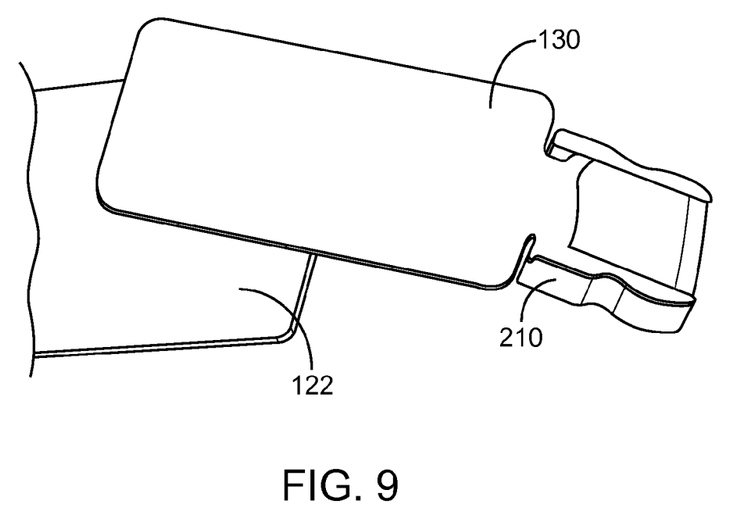
FIG. 9 illustrates another close-up view of a connector insert portion according to an embodiment of the present invention.

FIG. 9 illustrates another close-up view of a connector insert portion according to an embodiment of the present invention. Again, connector insert portion 110 may include housing 210. Pull tab 130 may also be included.

The above description of embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated. Thus, it will be appreciated that the invention is intended to cover all modifications and equivalents within the scope of the following claims.

What is claimed is:

1. A connector insert comprising:
   a housing having a first recess;
   a flexible circuit board at least partially wrapped around the housing;
   an integrated circuit coupled to the flexible circuit board and located in the first recess; and
   a plurality of contacts formed on the flexible circuit board and arranged to mate with a plurality of contacts in a receptacle of an electronic device.

2. The connector insert of claim 1 wherein the housing is metallic.

3. The connector insert of claim 1 wherein the plurality of contacts are located on a first end portion of the flexible circuit board, the housing further has a second recess, and the first end portion of the flexible circuit board is located in the second recess.

4. The connector insert of claim 1 further comprising a pull tab attached to the flexible circuit board.

5. The connector insert of claim 1 further comprising a pull tab attached to the connector insert.

6. A connector insert comprising:
   a housing having a first recess and a second recess;
   a flexible circuit board at least partially wrapped around the housing;
   a component attached to the flexible circuit board and located in the first recess; and
   a plurality of contacts located on a first end portion of the flexible circuit board and arranged to mate with a plurality of contacts in a receptacle of an electronic device, wherein the first end portion of the flexible circuit board is located in the second recess.

7. The connector insert of claim 6 wherein the component attached to the flexible circuit board comprises an integrated circuit.

8. The connector insert of claim 6 further comprising a pull tab attached to the flexible circuit board.

9. A method of manufacturing a connector insert comprising:
   forming a plurality of contacts on a first side at a first end portion of a flexible circuit board, the plurality of contacts arranged to mate with a plurality of contacts in a receptacle of an electronic device;

attaching a first component to a second side of a flexible circuit board;
aligning a housing over the first component such that the first component fits in a first recess of the housing;
at least partially wrapping the flexible circuit board around the housing; and
fitting the first end portion of the flexible circuit board in a second recess in the housing.

10. The method of claim 9 further comprising:
attaching a pull tab to the first side of the flexible circuit board.

11. The method of claim 9 wherein the housing is metallic.

12. A cable assembly including a connector insert arranged to have a low-profile when inserted into an electronic device, the cable assembly comprising:
a housing having a first recess, the housing formed to fit in a receptacle in the electronic device and having a back surface arranged to be substantially flush with an outside surface of an enclosure for the electronic device;
a flexible cable at least partially wrapped around the housing; and
a plurality of contacts formed on a first end portion of the flexible cable and arranged to mate with a plurality of contacts in the receptacle, the first end portion located in the first receptacle.

13. The cable assembly of claim 12 wherein the housing is metallic.

14. The cable assembly of claim 12 wherein the housing comprises a second recess, and wherein an integrated circuit is attached to the flexible cable and is located in the first recess.

15. The cable assembly of claim 12 further comprising a pull tab attached to the flexible cable.

16. The cable assembly of claim 12 further comprising a pull tab attached to the connector insert.

17. The cable assembly of claim 12 wherein the flexible cable is a flexible circuit board.

18. A cable assembly including a connector insert arranged to have a low-profile when inserted into an electronic device, the cable assembly comprising:
a housing having a first recess, the housing formed to fit in a receptacle in the electronic device and having a back surface arranged to be substantially flush with an outside surface of an enclosure for the electronic device;
a flexible circuit board at least partially wrapped around the housing;
an integrated circuit attached to the flexible circuit board and located in the first recess; and
a plurality of contacts formed on the flexible circuit board and arranged to mate with a plurality of contacts in the receptacle.

19. The cable assembly of claim 18 wherein the plurality of contacts are located on a first end portion of the flexible circuit board.

20. The cable assembly of claim 19 wherein the housing includes a second recess and the first end portion of the flexible circuit board is located in the second recess.

21. The cable assembly of claim 20 further comprising a pull tab attached to the flexible circuit board.

* * * * *